United States Patent
Betz et al.

(10) Patent No.: US 12,267,973 B2
(45) Date of Patent: Apr. 1, 2025

(54) HOUSING COVER AND METHOD FOR PRODUCING A HOUSING COVER

(71) Applicant: ELRINGKLINGER AG, Dettingen (DE)

(72) Inventors: Björn Betz, Trochtelfingen (DE); Jochen Schöllhammer, Dettingen (DE); Thilo Lutz, Stuttgart (DE); Tobias Kunert, Reutlingen (DE)

(73) Assignee: ELRINGKLINGER AG, Dettingen (DE)

( * ) Notice: Subject to any disclaimer, the term of this patent is extended or adjusted under 35 U.S.C. 154(b) by 198 days.

(21) Appl. No.: 17/961,511

(22) Filed: Oct. 6, 2022

(65) Prior Publication Data
US 2023/0035552 A1 Feb. 2, 2023

Related U.S. Application Data

(63) Continuation of application No. PCT/EP2021/058348, filed on Mar. 30, 2021.

(30) Foreign Application Priority Data

Apr. 8, 2020 (DE) .............. 10 2020 109 895.2

(51) Int. Cl.
  *H05K 5/06* (2006.01)
  *H05K 5/00* (2006.01)
  *H05K 5/10* (2025.01)
(52) U.S. Cl.
  CPC ............... *H05K 5/061* (2013.01); *H05K 5/10* (2025.01)
(58) Field of Classification Search
  CPC ....................... H05K 5/061; H05K 5/0004
  See application file for complete search history.

(56) References Cited

U.S. PATENT DOCUMENTS 11,991,849 B2 * 5/2024 Goehl .................. H05K 5/061
2006/0169099 A1 8/2006 Diez
(Continued)

FOREIGN PATENT DOCUMENTS

DE 19704532 A1 8/1998
EP 1683997 7/2006
(Continued)

OTHER PUBLICATIONS

International Searching Authority, "International Preliminary Report on Patentability," issued in connection with International Application No. PCT/EP2021/058348, Oct. 20, 2022, 15 pages, with English translation.
(Continued)

*Primary Examiner* — Michael Zhang
(74) *Attorney, Agent, or Firm* — Hanley, Flight & Zimmerman, LLC

(57) ABSTRACT

To create a housing cover for fixing to a housing, wherein the housing cover is provided with a plurality of fastening means through openings and with a sealing bead that comprises an elastomeric material, and wherein the sealing bead is arranged on a seal support face of the housing cover, in which housing cover the course of the sealing bead can be more freely designed and, in particular, laid closer to the fastening means through-openings of the housing cover and which, in particular, is producible from a sheet-shaped starting material, it is proposed that the housing cover comprises at least one deformation limiting element, which projects over the seal support face in the same direction as the sealing bead and limits a deformation of the sealing bead in the assembled state of the housing cover, wherein the deformation limiting element comprises at least one fastening means through-opening portion that extends along a circumferential direction of one of the fastening means (Continued)

through-openings over a circumferential angle α around the respective fastening means through-opening, and wherein the fastening means through-opening portion of the deformation limiting element comprises a plurality of partial element that are spaced at a distance from one another along the circumferential direction of the fastening means through-opening.

13 Claims, 6 Drawing Sheets

(56) References Cited

U.S. PATENT DOCUMENTS

| | | | |
|---|---|---|---|
| 2014/0001184 A1* | 1/2014 | Heiml | B65D 39/04 220/287 |
| 2015/0337962 A1* | 11/2015 | Lojewski | F16J 15/062 277/641 |
| 2017/0013737 A1 | 1/2017 | Kawabe et al. | |
| 2021/0227712 A1* | 7/2021 | Goehl | H05K 5/061 |

FOREIGN PATENT DOCUMENTS

| | | | |
|---|---|---|---|
| JP | H04259286 A | 9/1992 | |
| JP | 2004095929 | 3/2004 | |
| JP | 2010052506 | 3/2010 | |
| JP | 2011071362 A | 4/2011 | |
| JP | 2015141991 | 8/2015 | |
| JP | 2015141991 A * | 8/2015 | ............. H05K 5/061 |

OTHER PUBLICATIONS

German Patent and Trademark Office, "Search Report," Issued in connection with German Patent Application No. 102020109895.2, Apr. 30, 2023, 9 pages, with English machine translation.

European Patent Office, "Communication Pursuant to Rule 71(3) EPC," issued in connection with European Patent Application No. 21716350.0, dated Dec. 1, 2023, 18 pages. [With English Machine Translation].

International Searching Authority, "International Search Report and Written Opinion," issued in connection with International Application No. PCT/EP2021/058348, Jul. 21, 2021, 14 pages, with English translation.

* cited by examiner

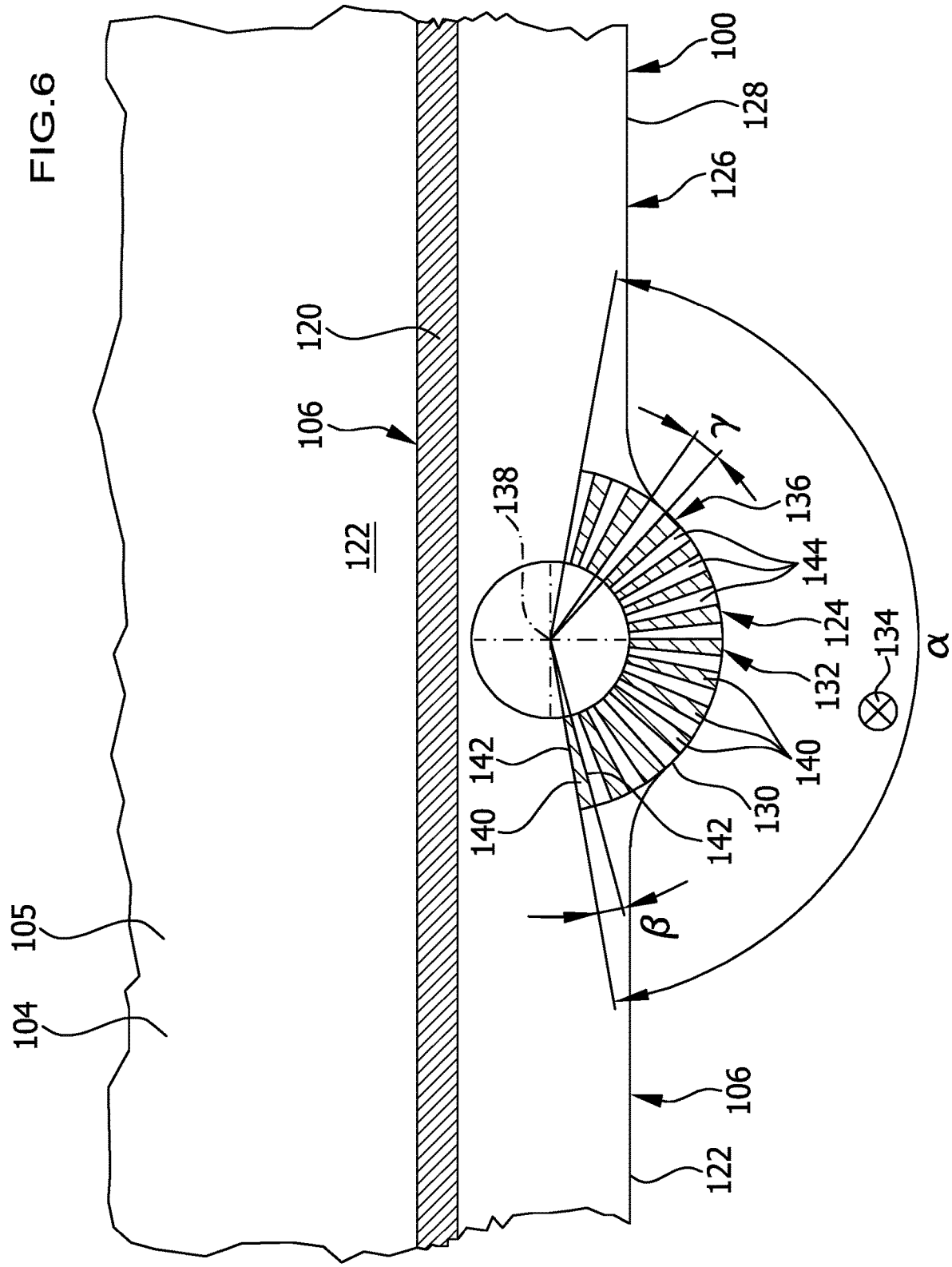

HOUSING COVER AND METHOD FOR PRODUCING A HOUSING COVER

RELATED APPLICATIONS

This application is a continuation of international application number PCT/EP2021/058348 filed on 30 Mar. 2021 and claims the benefit of German application number 10 2020 109 895.2 filed on 8 Apr. 2020.

The present disclosure relates to the subject matter disclosed in international application number PCT/EP2021/058348 of 30 Mar. 2021 and German application number 10 2020 109 895.2 of 8 Apr. 2020, which are incorporated herein by reference in their entirety and for all purposes.

FIELD OF THE DISCLOSURE

The present invention relates to a housing cover for fixing to a housing, wherein the housing cover is provided with a plurality of fastening means through-openings and with a sealing bead that comprises an elastomeric material, and wherein the sealing bead is arranged on a seal support face of the housing cover.

EP 1 683 997 A2 discloses a housing cover, in which a sealing bead made of an elastomeric material is arranged in a groove impressed in the housing cover.

Due to the requirement of providing a groove in the housing cover, the width of which in the non-pressed state of the housing cover has to be greater than the width of the sealing bead, the freedom in the design of the housing cover is limited.

SUMMARY OF THE INVENTION

In accordance with an embodiment of the invention, a housing cover of the kind stated at the outset is created, in which the course of the sealing bead can be more freely designed and, in particular, can be laid more closely to the fastening means through-openings of the housing cover and which, in particular, is also producible from a sheet-shaped starting material in a simple manner.

In accordance with an embodiment of the invention, provision is made in a housing cover with the features of the preamble of claim 1 that the housing cover comprises at least one deformation limiting element, which projects over the seal support face in the same direction as the sealing bead and limits a deformation of the sealing bead in the assembled state of the housing cover, wherein the deformation limiting element comprises at least one fastening means through-opening portion that extends along a circumferential direction of one of the fastening means through-openings over a circumferential angle $\alpha$ around the respective fastening means through-opening, and wherein the fastening means through-opening portion of the deformation limiting element comprises a plurality of partial elements that are spaced at a distance from one another along the circumferential direction of the fastening means through-opening.

In the housing cover in accordance with the invention, in the assembled state of the housing cover in which the sealing bead is pressed between the housing cover and the housing to be closed by means of the housing cover, the deformation limiting element is in the main force fit and the sealing bead is in the secondary force fit. This prevents an excessive deformation of the sealing bead.

At least one of the partial elements of the fastening means through-opening portion of the deformation limiting element, preferably all partial elements of the fastening means through-opening portion of the deformation limiting element, is/are preferably produced by means of an embossing operation or a deep-drawing operation on a base body of the housing cover.

The sheet-shaped or sheet metal-shaped starting material from which the housing cover is produced preferably has a thickness or material thickness of 2.0 mm or more.

Due to the division of the fastening means through-opening portion of the deformation limiting element into a plurality of partial elements, their respective size, shape, and positioning relative to one another and relative to the fastening means through-opening and relative to the sealing bead being freely selectable, the bracing force with which the housing cover is braced against the housing can be variably divided in a desired manner among the individual partial elements of the deformation limiting element and the sealing bead.

This makes it possible to achieve a secure and reliable sealing of the housing cover without excessively compressing the sealing bead.

The circumferential angle $\alpha$ by which the fastening means through-opening portion of the deformation limiting element extends around the respective fastening means through-opening is determined in relation to the longitudinal central axis of the respective fastening means through-opening.

This circumferential angle $\alpha$ is preferably more than 90°, in particular more than 120°, particularly preferably more than 150° for example about 160°.

Furthermore, the circumferential angle $\alpha$ by which the fastening means through-opening portion of the deformation limiting element extends around the respectively associated fastening means through-opening and which is determined in relation to the longitudinal central axis of the respective fastening means through-opening is preferably less than 270°, in particular less than 200°, particularly preferably at most 160°.

At least one of the partial elements of the fastening means through-opening portion of the deformation limiting element preferably extends over a circumferential angle $\beta$, which is determined in relation to the longitudinal central axis of the respective fastening means through-opening, of less than 70°, in particular less than 60°, particularly preferably less than 45°, for example less than 30°, in a particular embodiment less than 10°.

In particular, provision may be made that all partial elements of the fastening means through-opening portion of the deformation limiting element extend over a circumferential angle $\beta$ of less than 70°, in particular less than 60°, particularly preferably less than 45°, for example less than 30°, in a particular embodiment less than 10°.

In particular embodiments of the invention, provision is made that a gap is arranged between two respective partial elements that extend along the circumferential direction of the fastening means through-opening and at least one of the gaps extends over a circumferential angle of more than 5°, in particular more than 7°, particularly preferably more than 10°.

Provision is preferably made that all gaps between two respective partial elements that succeed one another along the circumferential direction of the fastening means through-opening each extend over a circumferential angle $\gamma$ of more than 5°, in particular more than 7°, particularly preferably more than 10°.

In a preferred embodiment of the invention, provision is made that the housing cover comprises a base body, in particular a base plate, and at least one of the partial elements is formed by reshaping, in particular embossing, the base body.

Preferably all partial elements of the fastening means through-opening portion of the deformation limiting element are formed by reshaping, preferably embossing, the base body.

It is particularly favorable if at least one of the fastening means through-openings is of stepped configuration.

In particular, provision may be made that the fastening means through-opening around which the fastening means through-opening portion of the deformation limiting element comprising a plurality of partial elements extends is of stepped configuration.

Provision may hereby be made that the fastening means through-opening of stepped configuration comprises a centering portion that faces toward the housing in the assembled state of the housing cover and an insertion position that faces away from the housing in the assembled state of the housing cover.

The insertion portion facilitates the insertion of the fastening means, for example a fastening screw, into the fastening means through-opening upon the assembly of the housing cover on the housing.

The centering portion makes it possible to precisely center the fastening means, for example a fastening screw, inserted into the fastening means through-opening in relation to a receptacle for the fastening means, for example a threaded hole, provided on the housing, which simplifies the assembly of the housing cover on the housing.

It is particularly favorable if the fastening means through-opening of stepped configuration comprises a tapering portion that is arranged between the centering portion and the insertion portion and tapers toward the centering portion.

Furthermore, provision may be made that at least one of the fastening means through-openings comprises a fastening means head support that is recessed in relation to a main face of the housing cover.

The main face is preferably arranged on the side of the housing cover facing away from the seal support face.

The main face of the housing cover is preferably oriented substantially perpendicular to the longitudinal central axes of the fastening means through-openings and/or substantially in parallel to the seal support face.

The recessed fastening means support comprises a fastening means head support face, which is recessed relative to the main face of the housing cover in the direction toward the housing and on which a head of the fastening means abuts, preferably in surface-to-surface contact, in the assembled state of the housing cover.

The partial elements from which the fastening means through-opening portion of the deformation limiting element may, in principle, have an outer contour shaped in any way.

It has proven to be favorable if at least one of the partial elements has an outer contour configured as a circular sector portion.

Preferably all partial elements of the fastening means through-opening portion of the deformation limiting element each have an outer contour configured as a circular sector portion.

The present invention further relates to a method for producing a housing cover for fixing to a housing, wherein the housing cover comprises a plurality of fastening means through-openings and a sealing bead, which is arranged on a seal support face of the housing cover.

Furthermore, in accordance with an embodiment of the invention, a method is created for producing such a housing cover, in which the course of the sealing bead can be more freely designed and, in particular, can be laid more closely to the fastening means through-openings of the housing cover and in which, in particular, the housing cover is producible from a sheet-shaped starting material in a simple manner.

In accordance with an embodiment of the invention, a method is provided for producing a housing cover for fixing to a housing,
 wherein the housing cover comprises
 a plurality of fastening means through-openings,
 a sealing bead, which is arranged on a seal support face of the housing cover, and
 at least one deformation limiting element, which projects over the seal support face in the same direction as the sealing bead and limits a deformation of the sealing bead in the assembled state of the housing cover, and
 wherein the deformation limiting element comprises at least one fastening means through-opening portion that extends along a circumferential direction of one of the fastening means through-openings over a circumferential angle $\alpha$ around the respective fastening means through-opening, and
 wherein the fastening means through-opening portion of the deformation limiting element comprises a plurality of partial elements that are spaced at a distance from one another along the circumferential direction of the fastening means through-opening,
 wherein the method comprises the following:
 embossing at least one of the partial elements in a base body of the housing cover;
 separating out the fastening means through-openings from the base body of the housing cover.

This method in accordance with the invention may further comprise the following:
 embossing a recessed fastening means head support in the base body of the housing cover.

Furthermore, the method in accordance with the invention may comprise the following:
 embossing a stepped delimiting wall of at least one fastening means through-opening in the base body of the housing cover.

Further particular embodiments of the method in accordance with the invention have already been described above in conjunction with particular embodiments of the housing cover in accordance with the invention.

The method in accordance with the invention for producing a housing cover is suited, in particular, for producing the housing cover in accordance with the invention.

The housing cover in accordance with the invention is suited, in particular, as a constituent part of an assembly, which comprises the housing cover, the housing to which the housing cover is to be fixed, and a plurality of fastening means for—preferably releasably—fixing the housing cover to the housing.

If the housing cover has a recessed fastening means head support, in the region of the fastening means through-opening the fastening means head support face for the head of the fastening means is preferably lowered substantially over the entire area by way of an embossing operation.

On the side of the housing cover opposite the recessed fastening means head support, the partial elements of the fastening means through-opening portion of the deformation limiting element are embossed out and the excess material is displaced in the component or is separated off, for example by punching out.

When using the housing cover in accordance with the invention, a tilting inward of the fastening means and the housing cover is prevented.

The force fit of the fastening means, for example of a fastening screw, required for fixing the housing cover to the housing is directed via the housing cover into a fastening means assembly region, for example a flange region, of the housing.

The compression of the sealing bead, for example in the form of a CIP (cured in place) bead to the height of the deformation limiting element over the seal support face of the housing cover in the secondary force fit is ensured.

The sealing bead can be placed very closely to the fastening means through opening, such that the fastening means assembly region, for example the flange region, of the housing can also be kept very narrow.

The starting material from which the housing cover is produced is preferably a sheet material.

Furthermore, the starting material is preferably a metallic material.

For example, the starting material may comprise aluminum, in particular as its main component.

The starting material may be an aluminum alloy.

Furthermore, provision may be made that the starting material is a steel material, preferably a stainless steel material.

The sealing bead may be configured as a CIP (cured in place) sealing bead or be produced by screen printing on the seal support face of the housing cover.

The housing that is closable by means of the housing cover may be, for example, a housing of a control device and/or of a constituent part of an electric drive, in particular an electric drive for an electric car.

Further features and advantages of the invention are subject matter of the subsequent description and the graphical representation of exemplary embodiments.

BRIEF DESCRIPTION OF THE DRAWINGS

FIG. 6 shows a plan view corresponding to FIG. 3 of the rim region of a third embodiment of a housing cover in which the partial elements of the fastening means through-opening portion of the deformation limiting element are more numerous and are of narrower configuration than in the first embodiment, with the viewing direction toward a seal support face of the housing cover that faces toward the housing in the assembled state of the housing cover.

The same or functionally equivalent elements are provided with the same reference numerals in all Figures.

DETAILED DESCRIPTION OF THE INVENTION

Figure 1:
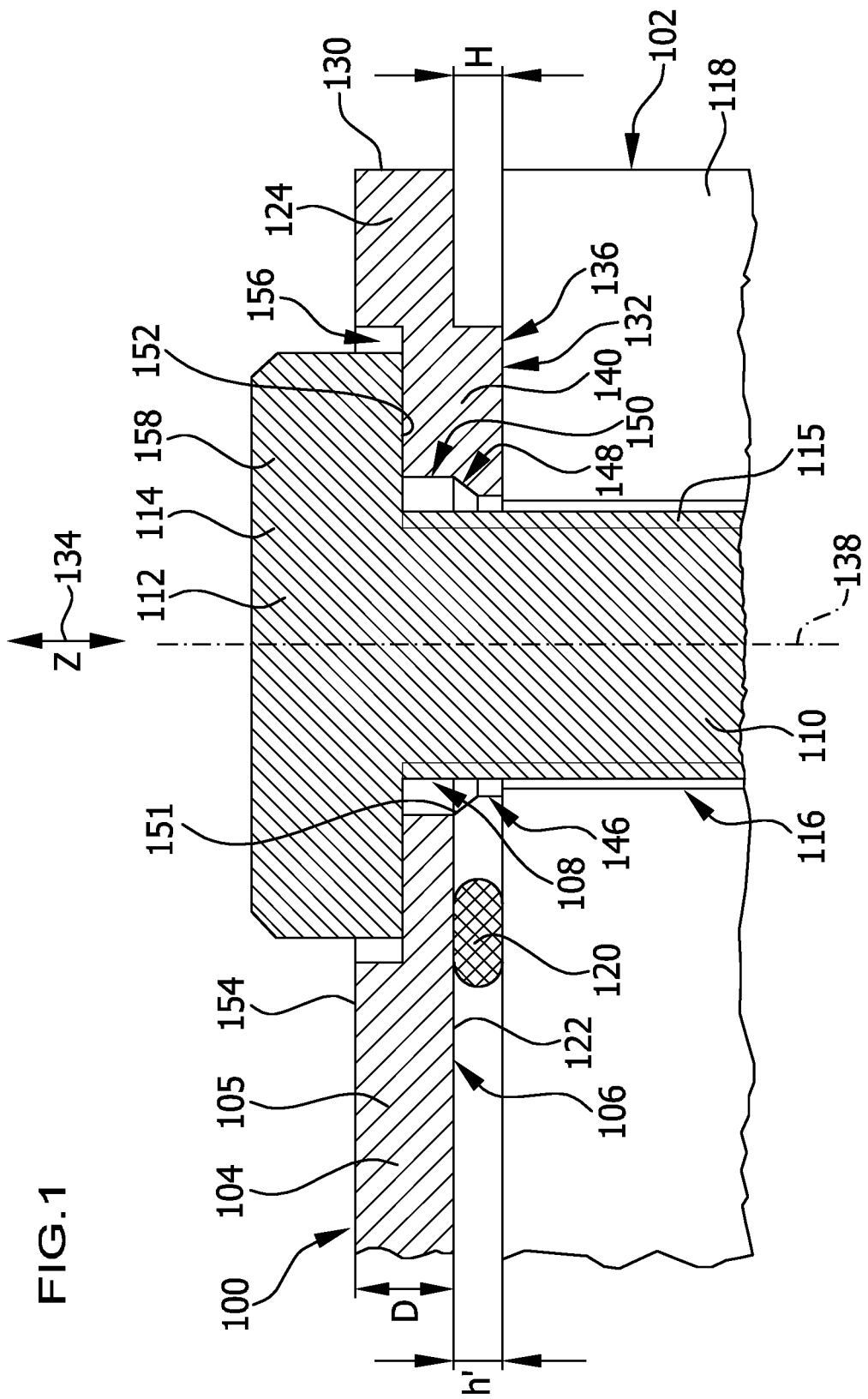
FIG. 1 shows a cut through a rim region of a housing cover that is fixed to a housing by means of a fastening means, wherein the housing cover comprises a fastening means through-opening, a sealing bead, and a deformation limiting element for limiting a deformation of the sealing bead in the assembled state of the housing cover, wherein the deformation limiting element in a fastening means through-opening portion thereof is subdivided into a plurality of partial elements that succeed one another along the circumferential direction of the fastening means through-opening and are spaced at a distance from one another along the circumferential direction, wherein the fastening means through-opening has a recessed fastening means head support, an insertion portion, a tapering portion, and a centering portion.
Figure 2:
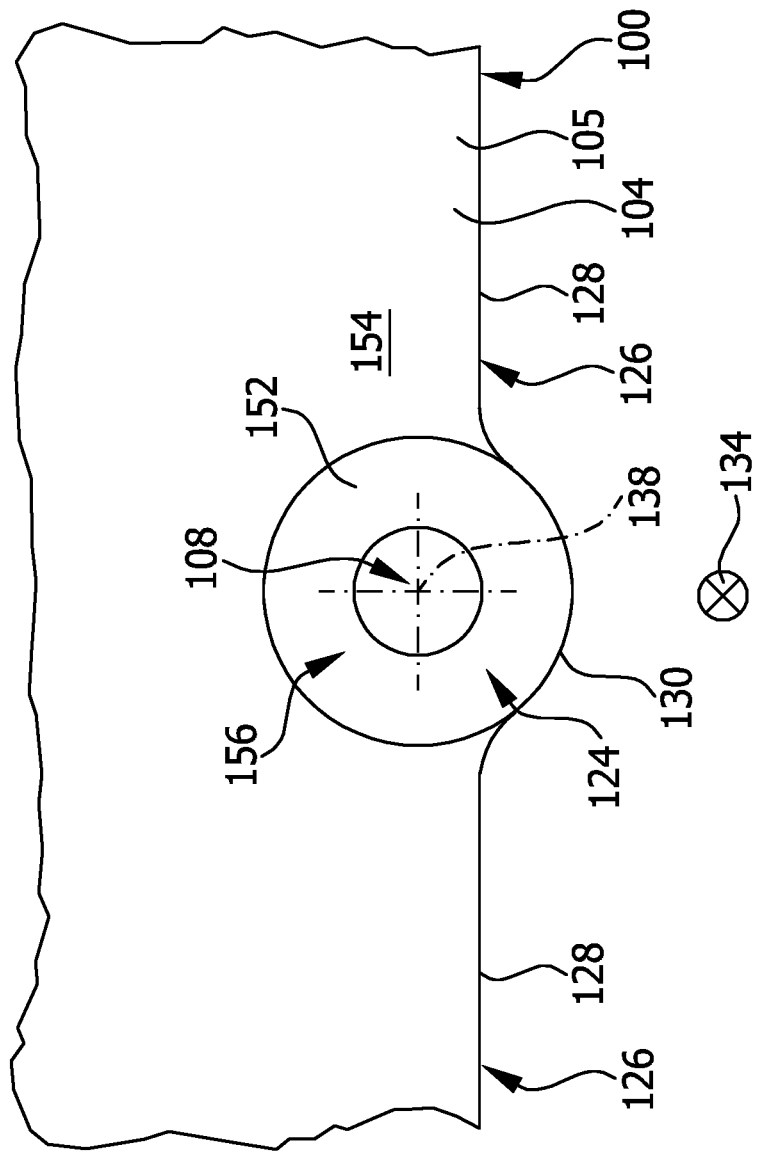
FIG. 2 shows a plan view of the rim region of the housing cover from above, with the viewing direction toward a main face of the housing cover that faces away from the housing in the assembled state of the housing cover, along arrow 2 in FIG. 1.
Figure 4:
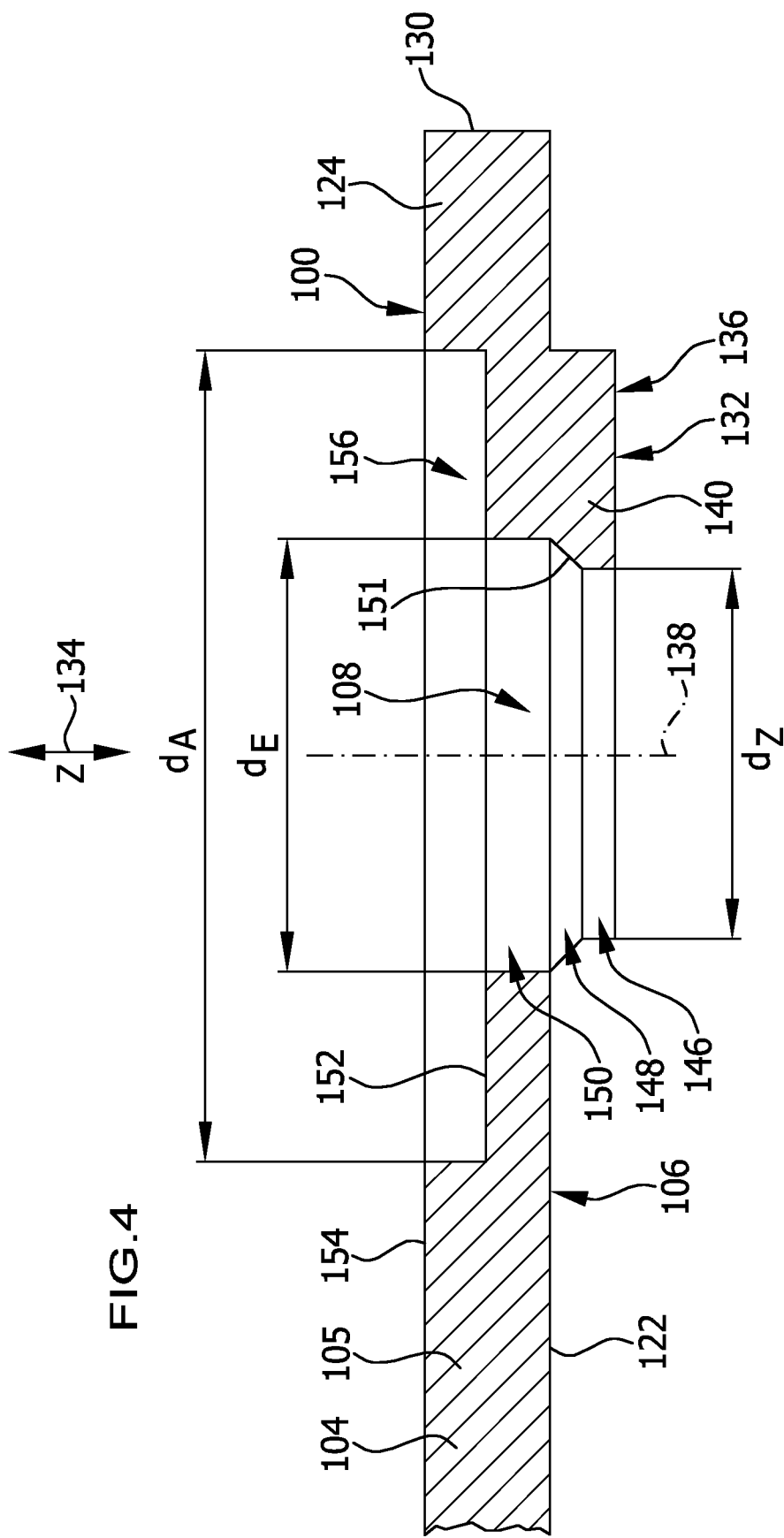
FIG. 4 shows a cut through a rim region of a base body of the housing cover from FIGS. 1 to 3 in a fastening means through-opening region of the housing cover in which a fastening means through-opening is arranged.

A housing cover, depicted sectionally in FIGS. 1 and 4 and denoted as a whole with 100, is provided for closing a housing opening on a housing 102, for example on a housing of a control device or a power inverter, in particular of a power inverter of a drive device for an electric car.

The housing cover 100 depicted as an example in the drawings comprises a base body 104, for example in the form of a metallic base plate 105, that comprises a seal support region 106.

Along the outer periphery of the seal support region 106 of the housing cover 100, the housing cover 100 is provided with a plurality of fastening means through-openings 108, which succeed one another along the periphery of the housing cover at 100 a distance from one another.

These fastening means through-openings 108 serve in the assembly of the housing cover 100 on the housing 102 to be closed to receive the shanks 110 of fastening means 112, preferably in the form of fastening screws 114 (cf. FIG. 1, which depicts the housing cover 100 in its assembled state on the housing 102 by means of the fastening means 112), which extend through the fastening means through-openings 108 and are screwed with their external threads 115 into corresponding internal threads of threaded holes 116 in fastening means assembly regions 118 of the housing 102 to be closed.

One or more of the fastening means through-openings 108 are preferably arranged at least partially in a respective fastening means through-opening region 124 of the housing cover 100, which is arranged between two intermediate fastening means through-opening regions 126 of the housing cover 100 and which projects outwardly over an outer rim 128 of the adjoining intermediate fastening means through-opening regions 126. The outer rim 130 of the fastening means through-opening region 124 preferably runs substantially along the circumferential direction of the respective fastening means through-opening 108.

For achieving a fluid-tight seal between the housing cover 100 and the housing 102 to be closed, a sealing bead 120 is provided, which is arranged on an inside of the housing cover 100 that in the assembled state of the housing cover 100 faces toward the inside space of the housing 102 to be closed and that forms a seal support face 122 of the housing cover 100.

The sealing bead 120 runs along the rim of the housing cover 100 and is preferably of annularly closed configuration.

The sealing bead 120 is made of an elastomeric material, for example of a silicone material, and can be formed, for example, by application by means of a dispenser (in a so-called CIP ("cured in place") method) or by a screen printing method on the seal support face 122.

When assembling the housing cover 100 on the housing 102 by means of the fastening means 112, the sealing bead 120 is compressed by tightening the fastening means 112 in the threaded holes 116 of the fastening means assembly regions 118 of the housing 102, the height of the sealing bead 120, i.e., its extent perpendicular to the seal support face 122, being reduced from the height h in the unloaded state to a value h' in the assembled state.

The elastic restoring force of the elastomeric sealing bead 120 then produces the sealing force with which the sealing bead 120 sealingly abuts on the housing 102.

To avoid excessive deformation of the sealing bead 120, the housing cover 100 comprises one or more deformation limiting elements 132, which project over the seal support face 122 in the same direction, namely in a Z-direction 134 oriented perpendicular to the seal support face 122, as the sealing bead 120 and limit a deformation of the sealing bead 120 in the assembled state of the housing cover 100.

The deformation limiting element 132 is configured to be stiffer than the sealing bead 120, preferably substantially rigid, such that the height h' of the sealing bead 120 in the pressed state thereof is limited at the bottom by the height H of the deformation limiting element 132 over the seal support face 122.

Figure 3:
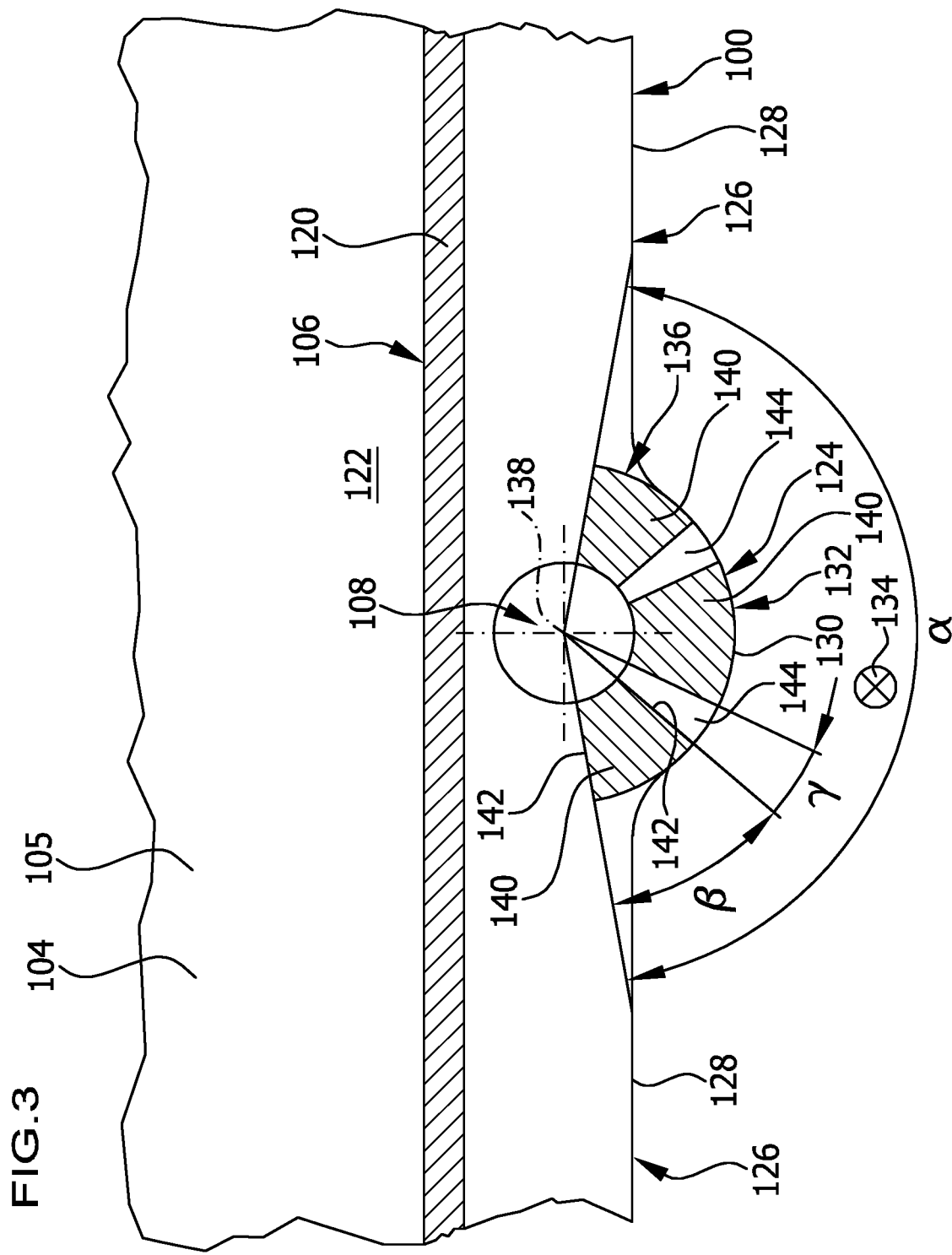
FIG. 3 shows a plan view of the rim region of the housing cover from below, with the viewing direction toward a seal support face of the housing cover that faces toward the housing in the assembled state of the housing cover, along arrow 3 in FIG. 1.

At least one of the deformation limiting elements 132 comprises a fastening means through-opening portion 136, which extends along a circumferential direction of a respectively associated fastening means through-opening 108 over a circumferential angle α around the respective fastening means through-opening 108 (cf. FIG. 3).

The circumferential angle α is determined in relation to a longitudinal central axis 138 of the fastening means through-opening 108, which extends in parallel to the Z-direction 134 through the middle of the fastening means through-opening 108.

The circumferential angle α is preferably more than 90°, in particular more than 120°, particularly preferably more than 150°.

Furthermore, the circumferential angle β is preferably less than 270°, in particular less than 180°, particularly preferably, for example, about 160° or less than 160°.

The fastening means through-opening portion 136 of the deformation limiting element 132 comprises a plurality, preferably two or more, three in the depicted embodiment, partial elements 140 that are spaced at a distance from one another along the circumferential direction of the fastening means through-opening 108.

Provision is preferably made that at least one of the partial elements 140 of the fastening means through-opening portion 136 extends over a circumferential angle β, in relation to the longitudinal central axis 138 of the fastening means through-opening 108, of less than 70°, in particular less than 60°, particularly preferably less than 45°, for example about 40°.

Provision is preferably further made that at least one of the partial elements 140 of the fastening means through-opening portion 136 of the deformation limiting element 132 extends over a circumferential angle β of more than 5°, in particular more than 10°, particularly preferably more than 30°, for example about 40°.

The partial elements may each be configured, for example, as a circular sector portion and preferably have lateral edges 142 running substantially radially to the longitudinal central axis 138 of the fastening means through-opening 108.

The circumferential angle β over which the partial elements 140 of the fastening means through-opening portion 136 of the deformation limiting element 132 each extend may be substantially equal to one another or different from one another.

A respective gap 144 is arranged between two respective partial elements 140 that succeed one another along the circumferential direction of the fastening means through-opening 108.

At least one of the gaps 144 extends preferably over a circumferential angle γ of more than 5°, in particular more than 7°, particularly preferably more than 10°, for example about 13°.

Furthermore, at least one of the gaps 144 preferably extends over a circumferential angle γ of less than 30°, in particular less than 20°, particularly preferably less than 15°.

The partial elements 140 are molded into the base body 104 of the housing cover 100 by embossing.

The fastening means through-opening 108 is preferably of stepped configuration.

In the embodiment of the housing cover 100 depicted in FIGS. 1 to 4, provision is made that the fastening means through-opening 108 comprises a centering portion 146 that faces toward the housing 102 in the assembled state of the housing cover 100.

The centering portion 146 is preferably of substantially circular cylindrical configuration and has a diameter $d_Z$.

Furthermore, the fastening means through-opening 108 preferably comprises a tapering portion 148 that adjoins the centering portion 146 and tapers toward the centering portion 146.

The tapering portion 148 is of substantially truncated circular cone-shaped configuration and tapers from a diameter $d_E$ at the end of the tapering portion 148 remote from the centering portion 146 to the diameter $d_Z$ at the end of the tapering portion 148 pointing toward the centering portion 146.

Furthermore, the fastening means through-opening 108 comprises an insertion portion 150 adjoining the tapering portion 148.

The insertion portion 150 is preferably of substantially circular cylindrical configuration and has a diameter $d_E$.

The delimiting faces at the periphery of the insertion portion 150 of the tapering portion 148 and of the centering portion 146 together form a stepped delimiting wall 151 of the fastening means through-opening 108.

The insertion portion 150 of the fastening means through-opening 108 opens on a fastening means head support face 152, which forms a delimitation of a fastening means head support 156 that is recessed in relation to a main face 154 of the housing cover 100.

The main face 154 of the housing cover 100 is arranged on the side of the housing cover 100 that faces away from the seal support face 122.

The fastening means head support 156, the insertion portion 150, the tapering portion 148, and the centering portion 146 of the fastening means through-opening 108 are each arranged concentrically to the longitudinal central axis 138 of the fastening means through-opening 108.

The diameter $d_Z$ of the centering portion 146 is smaller than the diameter $d_E$ of the insertion portion 150.

The diameter $d_E$ of the insertion portion 150 is smaller than the diameter $d_A$ of the fastening means head support 156.

As can be seen in FIG. 1, the head 158 of the fastening means 112 abuts in surface-to-surface contact against the fastening means head support face 152 of the fastening means head support 156 in the assembled state of the housing cover 100.

The insertion portion 150 and the tapering portion 148 of the fastening means through-opening 108 facilitates the insertion of the shank 110 of the fastening means 112 into the fastening means through-opening 108 and from there into the threaded hole 116 in the fastening means assembly region 118 of the housing 102.

The centering portion 146 of the fastening means through-opening 108 centers the shank 110 of the fastening means 112 relative to the longitudinal central axis 138, such that the longitudinal central axis of the fastening means 112 coincides with the longitudinal central axis 138 of the fastening means through-opening 108, and relative to the threaded hole 116 in the fastening means assembly region 118 of the housing 102.

The housing cover 100 is made from a sheet-shaped starting material, in particular from a metallic sheet metal material that has a material thickness or thickness D, which is preferably greater than 1.5 mm, particularly preferably greater than 2.0 mm.

The thickness D of the starting material of the housing cover 100 is preferably less than 5.0 mm, particularly preferably less than 3.0 mm.

The housing cover 100 including the deformation limiting element 132 is produced from this starting material as follows:

The recessed fastening means head support 156 and the stepped delimiting wall 151 of the fastening means through-opening 108 are embossed in the starting material.

The partial elements 140 of the deformation limiting element 132 are formed.

The fastening means through-opening 108 is separated out, for example cut out, preferably by means of a laser, or punched out from the starting material.

The sealing bead 120 is formed by application from a dispenser or by screen printing on the seal support face 122.

As a result of the deformation limiting element 132, also referred to as a stopper, in the assembly of the housing cover 100 on the housing 102, the sealing bead 120 is compressed to a defined measure h', which corresponds to the height H of the deformation limiting element 132 over the seal support face 122.

An over-compression of the sealing bead 120 is thereby prevented.

The metallic starting material from which the housing cover 100 is made may comprise, in particular, aluminum or an aluminum alloy.

Alternatively hereto, provision may also be made that the starting material from which the housing cover 100 is made is a stainless steel material.

In principle, any other sheet-shaped, in particular metallic, starting material comes into consideration for the production of the housing cover 100.

Figure 5:
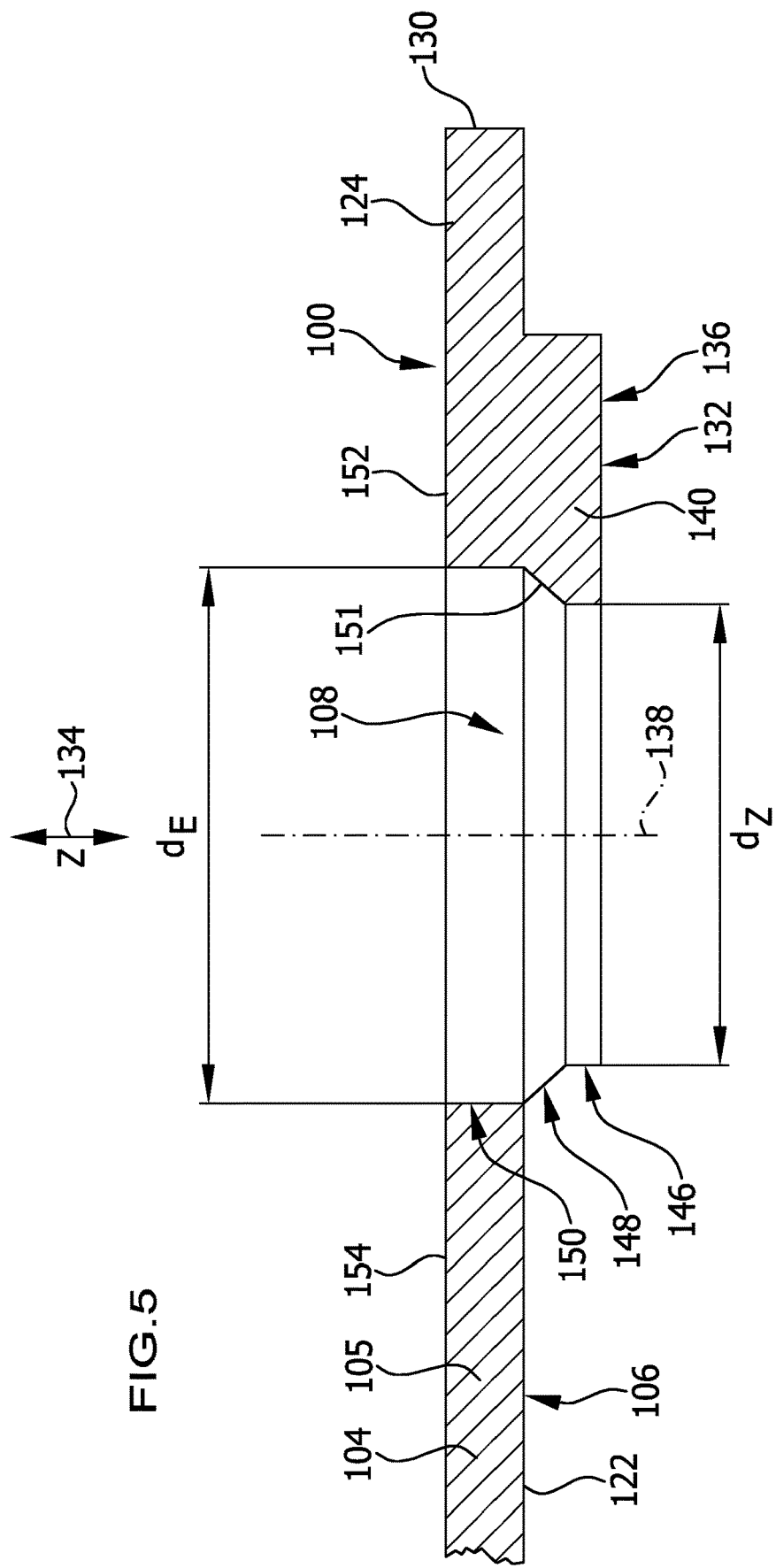
FIG. 5 shows a cut through a rim region of a base body of the housing cover in a second embodiment of the housing cover in a fastening means through-opening region in which a fastening means through-opening is arranged, wherein the fastening means through-opening has no recessed fastening means head support, but instead an insertion portion of the fastening means through-opening opens directly on a main face of the housing cover that faces away from the housing in the assembled state of the housing cover.

A second embodiment of a housing cover 100 depicted sectionally in FIG. 5 differs from the first embodiment described above and depicted in FIGS. 1 to 4 in that the fastening means through-opening 108 in this second embodiment has no recessed fastening means head support 156, but instead the insertion portion 150 of the fastening means through-opening 108 opens directly on the main face 154 of the housing cover 100, which in this embodiment simultaneously serves as a fastening means head support face 152.

In this embodiment, in the assembled state of the housing cover 100, the head 158 of the fastening means 112 abuts against the main face 154 of the housing cover 100 serving as a fastening means head support face 152.

This embodiment of the housing cover 100 without a recessed fastening means head support 156 is preferably used when the thickness or material thickness of the starting material is less than 3.0 mm.

In the production of the second embodiment of the housing cover 100, one proceeds as follows:

The stepped delimiting wall 151 of the fastening means through-opening 108 and the partial elements 140 of the deformation limiting element 132 are embossed in the starting material.

The centering portion 146 of the fastening means through-opening 108 is separated out, for example cut out, preferably by means of a laser, or punched out from the starting material.

The sealing bead 120 is produced on the seal support face 122 of the housing cover 100 by application from a dispenser or by screen printing.

In all other respects, the second embodiment of a housing cover 100 depicted in FIG. 5 corresponds with respect to structure, function, and production method with the first embodiment depicted in FIGS. 1 to 4, to the preceding description of which reference is made in this regard.

A third embodiment of a housing cover 100 depicted sectionally in FIG. 6 differs from the first embodiment described above and depicted in FIGS. 1 to 4 in that the fastening means through-opening portion 136 of the deformation limiting element 132 has a greater number of partial elements 140, which each extend over a smaller circumferential angle β.

In particular, provision may be made that the number of partial elements 140 of the fastening means through-opening portion 136 of the deformation limiting element 132 is five or more, in particular seven or more, particularly preferably ten or more, for example thirteen.

Provision is preferably further made that at least one of the partial elements 140 of the fastening means through-opening portion 136 of the deformation limiting element 132 extends over a circumferential angle β, in relation to the longitudinal central axis 138 of the fastening means through-opening 108, of less than 30°, in particular less than 20°, particularly preferably less than 10°, for example about 5°.

In this embodiment, the gaps 144, which each extend between two partial elements 140 succeeding one another along the circumferential direction of the fastening means through-opening 108, extend preferably over a circumferential angle γ of less than 30°, in particular less than 20°, particularly preferably less than 10°, for example about 5°.

In this embodiment, the partial elements 140 of the deformation limiting element 132 are configured as very narrow circular segment portions, which gives them a ray-like appearance.

The fastening means through-opening portion 136 of the deformation limiting element 132 therefore has a corona-shaped form.

In all other respects, the third embodiment of a housing cover 100 depicted in FIG. 6 corresponds with respect to structure, function, and production method with the first embodiment depicted in FIGS. 1 to 4, to the preceding description of which reference is made in this regard.

Furthermore, it is also possible in the third embodiment of a housing cover 100 to omit the recessed fastening means head support 156, such that the insertion portion 150 of the fastening means through-opening 108 opens directly on the main face 154 of the housing cover 100, which then simultaneously serves as a fastening means head support face 152, as in the second embodiment of a housing cover 100 depicted in FIG. 5.

The invention claimed is:

1. A housing cover for fixing to a housing, wherein the housing cover is provided with a plurality of fastening means through-openings and with a sealing bead that comprises an elastomeric material, and
   wherein the sealing bead is arranged on a seal support face of the housing cover,
   wherein the housing cover comprises at least one deformation limiting element, which projects over the seal support face in the same direction as the sealing bead and limits a deformation of the sealing bead in an assembled state of the housing cover,
   wherein the deformation limiting element comprises at least one fastening means through-opening portion that extends along a circumferential direction of one of the fastening means through-openings over a circumferential angle around the respective fastening means through-opening, and
   wherein the fastening means through-opening portion of the deformation limiting element comprises a plurality of partial elements that are spaced at a distance from one another along the circumferential direction of the fastening means through-opening.

2. The housing cover in accordance with claim 1, wherein the fastening means through-opening portion of the deformation limiting element extends over a circumferential angle of at most 160° around the fastening means through-opening.

3. The housing cover in accordance with claim 1, wherein at least one of the partial elements of the fastening means through-opening portion extends over a circumferential angle of less than 70°.

4. The housing cover in accordance with claim 1, wherein a gap is arranged between two respective partial elements that succeed one another along the circumferential direction of the fastening means through-opening, and at least one of the gaps extends over a circumferential angle of more than 5°.

5. The housing cover in accordance with claim 1, wherein the housing cover comprises a base body and at least one of the partial elements is formed by embossing the base body.

6. The housing cover in accordance with claim 1, wherein at least one of the fastening means through-openings is of stepped configuration.

7. The housing cover in accordance with claim 6, wherein the fastening means through-opening of stepped configuration comprises a centering portion that faces toward the housing in the assembled state of the housing cover and an insertion portion that faces away from the housing in the assembled state of the housing cover.

8. The housing cover in accordance with claim 7, wherein the fastening means through-opening of stepped configuration comprises a tapering portion that is arranged between the centering portion and the insertion portion and tapers toward the centering portion.

9. The housing cover in accordance with claim 1, wherein at least one of the fastening means through-openings comprises a fastening means head support that is recessed in relation to a main face of the housing cover.

10. The housing cover in accordance with claim 1, wherein at least one of the partial elements has an outer contour configured as a circular sector portion.

11. A method for producing a housing cover for fixing to a housing,
    wherein the housing cover comprises
    a plurality of fastening means through-openings,
    a sealing bead, which is arranged on a seal support face of the housing cover, and
    at least one deformation limiting element, which projects over the seal support face in the same direction as the sealing bead and limits a deformation of the sealing bead in an assembled state of the housing cover, and
    wherein the deformation limiting element comprises at least one fastening means through-opening portion that extends along a circumferential direction of one of the fastening means through-openings over a circumferential angle around the respective fastening means through-opening, and
    wherein the fastening means through-opening portion of the deformation limiting element comprises a plurality of partial elements that are spaced at a distance from one another along the circumferential direction of the fastening means through-opening,
    wherein the method comprises the following:
    embossing at least one of the partial elements in a base body of the housing cover; and
    separating out the fastening means through-openings from the base body of the housing cover.

12. The method in accordance with claim 11, wherein the method further comprises the following:
    embossing a recessed fastening means head support in the base body of the housing cover.

13. The method in accordance with claim 11, wherein the method further comprises the following:
    embossing a stepped delimiting wall of at least one fastening means through-opening in the base body of the housing cover.

* * * * *